United States Patent
Bianchi et al.

(10) Patent No.: US 7,099,201 B1
(45) Date of Patent: Aug. 29, 2006

(54) MULTIFUNCTIONAL LATCH CIRCUIT FOR USE WITH BOTH SRAM ARRAY AND SELF TEST DEVICE

(75) Inventors: Andrew James Bianchi, Austin, TX (US); Yuen Hung Chan, Poughkeepsie, NY (US); William Vincent Huott, Holmes, NY (US); Michael Ju Hyeok Lee, Austin, TX (US); Edelmar Seewann, Austin, TX (US); Philip George Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 11/055,043

(22) Filed: Feb. 10, 2005

(51) Int. Cl.
*G11C 7/10* (2006.01)
(52) U.S. Cl. ............... 365/189.05; 365/185.08; 365/230.08
(58) Field of Classification Search ........... 365/189.05, 365/185.08, 230.08, 191, 205
See application file for complete search history.

(56) References Cited

U.S. PATENT DOCUMENTS 5,751,727 A * 5/1998 Martens .................. 714/718
6,930,941 B1 * 8/2005 Nakase .................. 365/205

* cited by examiner

*Primary Examiner*—Richard Elms
*Assistant Examiner*—Dang Nguyen
(74) *Attorney, Agent, or Firm*—Duke W. Yee; Mark E. McBurney; James O. Starstein

(57) ABSTRACT

An apparatus and method is provided that combines both self test and functional features in a single latch circuit, which may be used with an SRAM array and is usefully embodied as an L1-L2 latch. During partial writes from an SRAM array, data bits of unknown state are inhibited from entering the latch circuit, while data for testing is allowed to enter. In one useful embodiment of the invention the latch circuit is used with a mode control that provides mode select signals to operate the latch circuit in one of a plurality of modes, including at least full write and partial write modes. The latch circuit further includes a data hold circuit for selectively receiving and storing data coupled to the latch circuit. A first enabling circuit responsive to the mode select signals enables the hold circuit to receive all the data contained in the array during a full write mode, and further enables the hold circuit to receive only some of the data bits contained in the array during a partial write mode.

20 Claims, 3 Drawing Sheets

MULTIFUNCTIONAL LATCH CIRCUIT FOR USE WITH BOTH SRAM ARRAY AND SELF TEST DEVICE

BACKGROUND OF THE INVENTION

1. Technical Field

The invention disclosed and claimed herein generally pertains to a latch or latch circuit adapted to perform both self test and functional tasks and operations. More particularly, the invention pertains to a latch of the above type wherein functional tasks include writing data into the latch from a Static Random Access Memory (SRAM) array. Even more particularly, the invention pertains to a latch of the above type wherein data bits of unknown state from the SRAM array are prevented from entering the latch, while data for self testing is allowed into the latch.

2. Description of Related Art

As is known by those of skill in the art, flush latches are commonly used to receive data from an array of SRAMs, such as to move data stored temporarily in an SRAM to more permanent storage. It is also known that certain types of SRAMs support partial writes and write throughs. A write through occurs when data written into an SRAM is immediately made available at the output thereof. A partial write occurs when only some of the bit locations of the SRAM are being written to. For example, it could be economical to write only four of eight bits associated with an ASIC to an SRAM. In this situation, data would not be written into some of the bit locations of the SRAM. Accordingly, the read mechanism cannot guarantee to the latch that the contents or states of these bit locations are correct. Herein, bits or bit levels of this type are referred to as "X" states. Generally, when only certain bits in the SRAM are being written to and are thus known, it will be desirable to update only the latches of those written bits. Bits in the SRAM that are not being written to should not be used to update their associated latches. Otherwise, the latch would be written with an unknown state or "X" state.

Those of skill in the art have frequently found it useful to provide groups or sequences of latches with an Automatic Built-in Self Testing (ABIST) capability. In one arrangement, a Multiple Input Shift Register (MISR) is used for this purpose. The MISR is operated to move self test data, or p-bit data, along a latch bus to a sequence of latches connected to the bus. It would be advantageous to provide a simplified latch that could be used in connection with an SRAM array, including SRAMs that supported partial writes and write throughs, wherein the latch also was adapted for use with self test procedures such as those referred to above.

SUMMARY OF THE INVENTION

The invention generally combines both self test and functional features in a single, simplified latch circuit. The latch circuit of the invention may be used with an SRAM array and may usefully be embodied as an L1-L2 latch, although it is by no means limited to such embodiment. During partial writes from an SRAM array, data bits of an "X" state are inhibited from entering the latch circuit, while data for testing is allowed to enter. One useful embodiment of the invention, directed to a latch circuit for use with one or more RAMS comprising an array, includes a mode control for providing mode select signals to operate the latch circuit in one of a plurality of modes, the plurality of modes including at least full write and partial write modes. This embodiment further includes a data hold circuit for selectively receiving and storing data coupled to the latch circuit. A first enabling circuit responsive to the mode select signals enables the hold circuit to receive all the data contained in the array during a full write mode, and further enables the hold circuit to receive only some of the data bits contained in the array during a partial write mode, while preventing other data bits of "X" state from entering the latch circuit.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
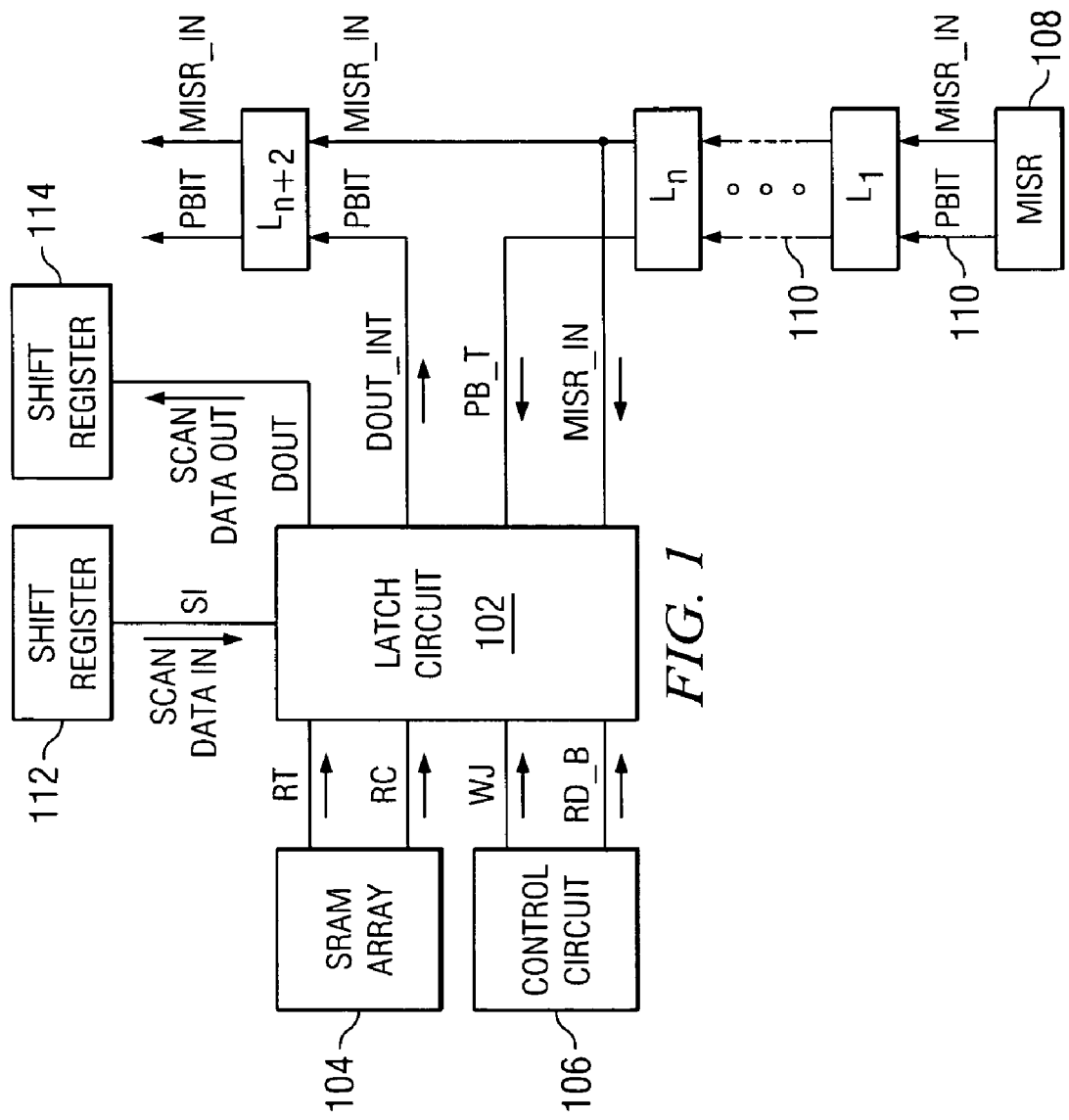
FIG. 1 is a block diagram showing a system that includes an embodiment of the invention.

Referring to FIG. 1, there is shown a latch circuit 102 comprising an embodiment of the invention. Latch circuit 102 is coupled to an SRAM array 104 comprising a specified number of SRAMs, through latch circuit terminals RT and RC. At least some of the SRAMs of array 104 have both partial write and write through capabilities, as described above.

Referring further to FIG. 1, there is shown a control circuit 106 for supplying latch circuit 102 with control signals WJ and RD_B. As described hereinafter in further detail, latch circuit 102 is selectively operated through either a full read cycle, or a partial write cycle. During a full read cycle, all the data in SRAM array 104 is read out of the array, and written into the latch circuit 102. During a partial write cycle, data bits that have just been written through the SRAM array, and are thus of known states or levels, are written into latch circuit 102. However, the bits in bit locations in the SRAM that have not been written to during the write through, and are thus at an "X" state as defined above, are not allowed to enter the latch circuit 102.

FIG. 1 further shows latch circuit 102 connected to a MISR device 108, described above, through a latch bus 110. Test data, or p-bit data, is shifted along bus 110 through a sequence of latches $L_1$–$L_n$ connected along the bus, between MISR 108 and latch circuit 102. The p-bit data is shifted from latch $L_n$ into latch circuit 102, when the latch circuit receives an enabling signal MISR_IN from MISR 108, and as further described hereinafter.

FIG. 1 shows a shift register 112, or other source of data, connected to enter data into latch circuit 102 through an SI terminal. This occurs when the latch circuit latch 102 is in a scan data in mode. This mode may be used to enter data such as a prespecified data value into the latch circuit 102. During this mode, latch circuit 102 is able to operate as an LSSD register. Shift register 114, or other recipient of data, is connected to an output terminal DOUT to receive data from latch circuit 102, when the latch circuit is in a scan data out mode.

Referring further to FIG. 1, there is shown a latch $L_{n+2}$ connected to a DOUT_INT terminal of latch circuit 102, to receive the p-bit data therefrom. After passing through $L_{n+2}$ and any remaining latches of the latch sequence connected to bus 110, the p-data is processed, in order to determine whether respective latches of the sequence, including latch circuit 102, are in good, working condition.

Figure 2A:
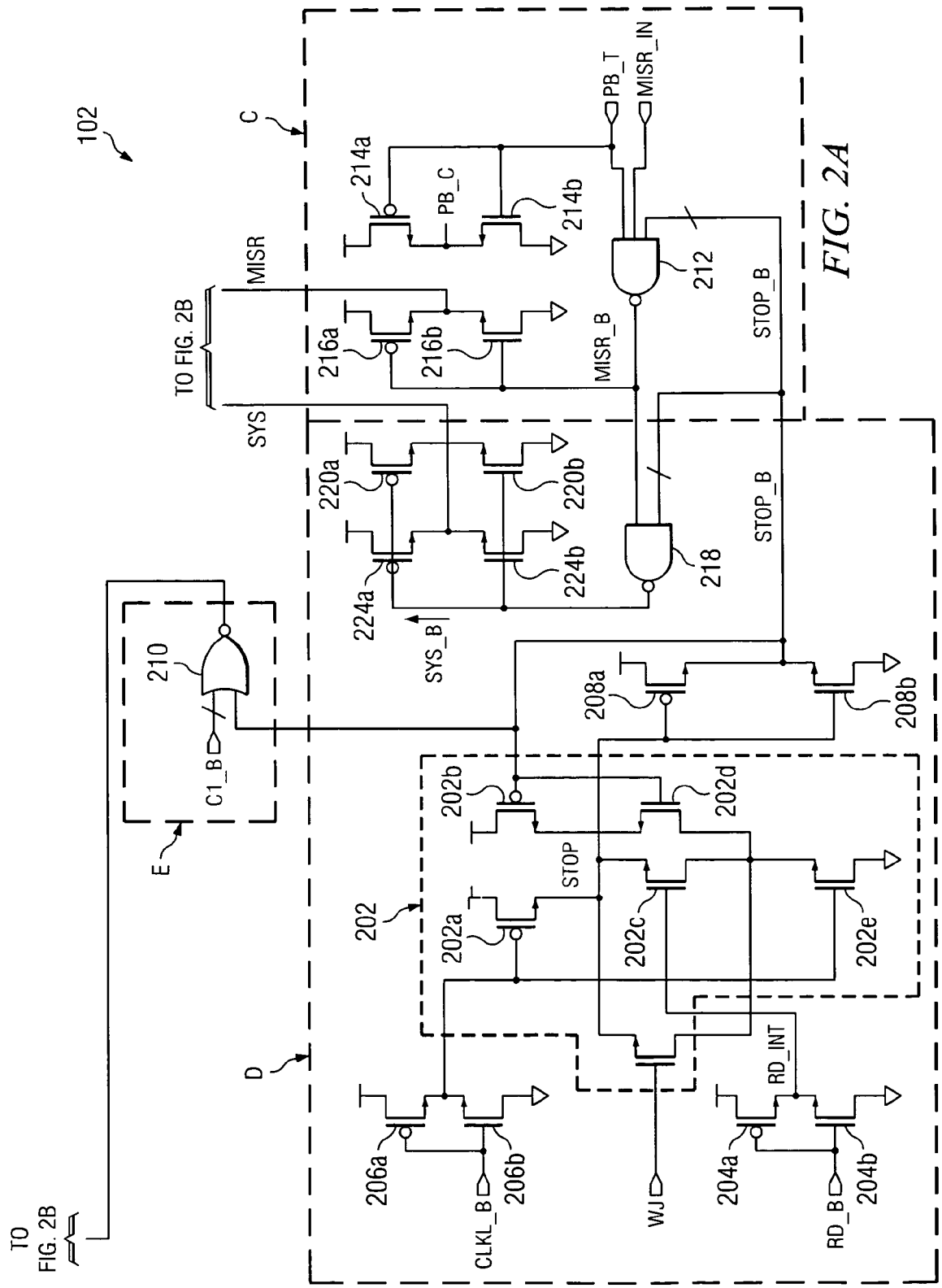
FIGS. 2A and 2B are two parts of a circuit diagram that together show an embodiment of the invention.
Figure 2B:
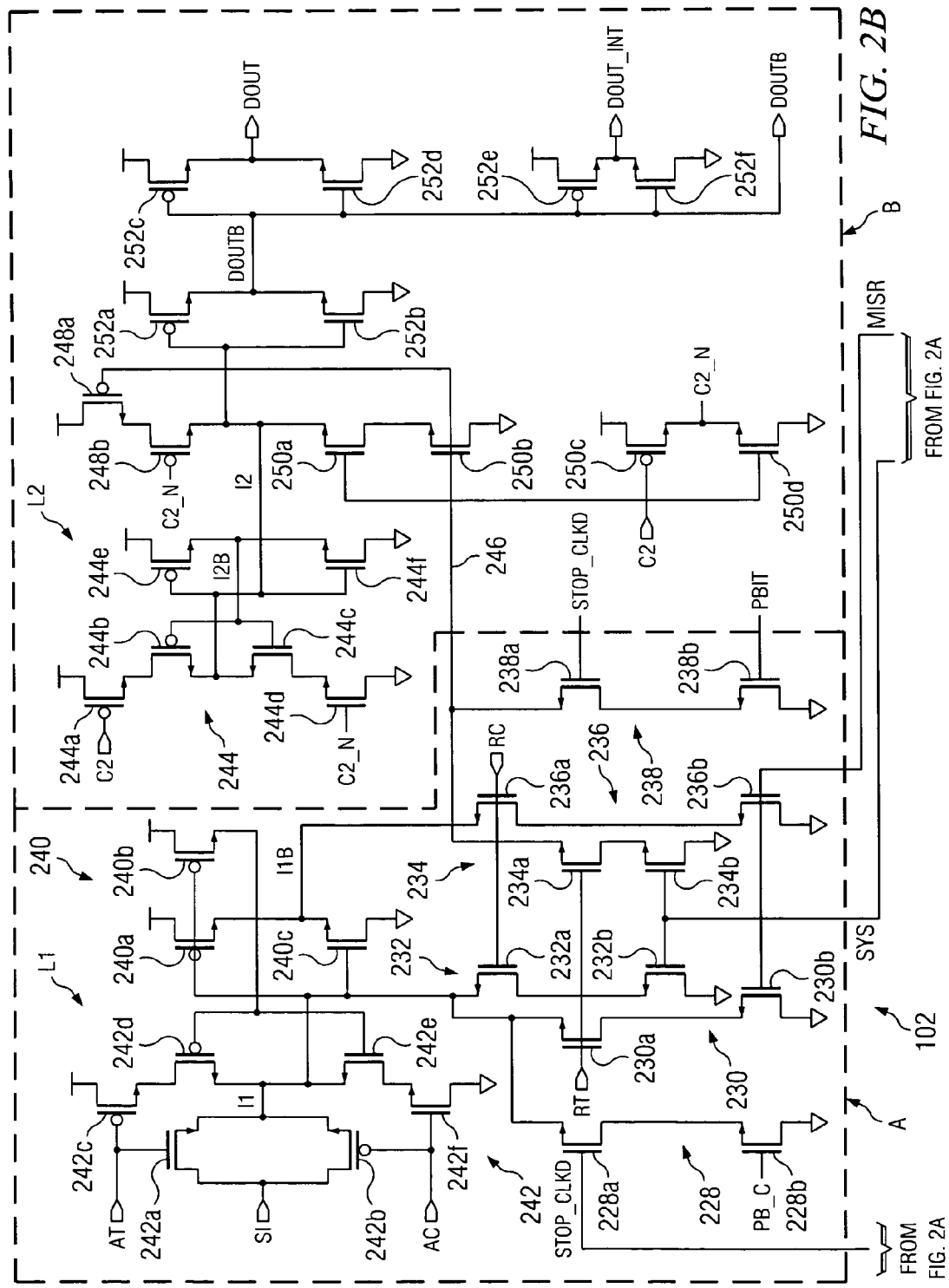

Referring to FIG. 2A, there is shown latch circuit 102 disposed to receive WJ control signals, through its WJ terminal, into a gate 202 comprising transistors 202a–e. Gate 202 is also connected to receive read signals RD_B, through an inverter comprising transistors 204a–b. Gate 202 is clocked by clock signal CLKL_B, through transistors 206a and 206b. When the MISR_IN signal is enabled, the latch L1, shown in FIG. 2B, is written with the data XOR (exclusive OR) p-bit. A circuit for implementing the XOR function, to provide the data XOP p-bit, is described hereinafter.

To carry out a full read cycle, whereby all data is read out of SRAM array 104 and written into latch circuit 102, a signal sent from control circuit 106 sets the WJ terminal to 0, and sets the read signal RD_INT, through 204a–b, to 1. To carry out a partial write cycle, in order to write only some of the data bits in the SRAM array 104 to latch circuit 102, that is, only data bits that are of known state, the read signal becomes 0. WJ is set to 1 to read known data bits out of the SRAM array, but is set to 0 to prevent bits of "X" state from being read out of the array and thus written into latch circuit 102.

Components of gate 202 are respectively selected and configured so that the STOP output of the gate 202 goes low, or to logic 0, when either WJ or the read signal, or both of them together, are at logic 1.

FIG. 2A further shows the STOP output providing an inverted signal STOP_B, through an inverter comprising transistors 208a–b. Thus, gate 202, together with transistors 208a–b comprises a dynamic OR gate. That is, the output STOP_B goes high, or to logic 1, whenever at least WJ or the read signal, or both, is at logic 1. At least one of these conditions will be applied to latch circuit 102 whenever data is to be written into the latch circuit, either during a full read or a partial write cycle. Both the input WJ and the read signal will be 0 only when data is not to be written into the latch circuit from the SRAM array. When this occurs, the output STOP_B will also go to logic 0.

Referring further to FIG. 2A, there is shown a NOR gate 210 receiving the STOP_B signal as one of its inputs. The other input to NOR gate 210 comprises a clock signal C1_B. Thus, when either WJ or the read signal is at logic 1, the dynamic OR gate 202 applies logic 1 to NOR gate 210, so that the output of NOR gate 210 is held to 0. As described hereinafter in further detail, the output of NOR gate 210 is used to ensure that p-bit data can be written into latch circuit 102 only when data is not being written thereinto from the SRAM array.

FIG. 2A shows latch circuit 102 further provided with a 3-input NAND gate 212 that receives the STOP_B signal as one of its inputs. The other two inputs to NAND gate 212 comprise the p-bit data and the MISR_IN enabling signal from the latch sequence bus 110. The p-bit data signal PB_T is also coupled through transistors 214a–b, to provide p-bit data signal PB_C. The output of NAND gate 212, coupled through transistors 216a–b, provides a MISR enabling signal. The p-bit data cannot be written into latch circuit 102 unless the MISR signal is on. When the MISR_IN signal is enabled, the latch L1, shown in FIG. 2B, is written with the data XOR (exclusive OR) p-bit. A circuit for implementing the XOR function, to provide the data XOR p-bit, is described hereinafter.

Referring further to FIG. 2A, there is shown a NAND gate 218 receiving the output of NAND gate 212 as one of its inputs, and STOP_B its other input. The output of NAND gate 218 is coupled through transistors 220a–b and 224a–b to provide an enabling signal SYS. Data from the SRAM array can be written into the latch circuit 102 only when SYS is on.

When the MISR_IN and SYS signals are 0 and the C1_B clock is toggling, the p-bit data alone is written to the latch L1, through transistors 228a–b or 238a–b, shown in FIG. 2B.

Referring to FIG. 2B, there is shown latch L1 of latch circuit 102. Data can be written into latch L1, for retention in the latch circuit 102 for some period of time, through one of six pull down legs 228–238. The pull down legs 228–238 shown in FIG. 2B respectively comprise the sets of transistors 228a–b through 238a–b. The pull down legs 232 and 234 are connected to the terminals RC and RT, respectively, that are coupled to receive data from SRAM array 104 as described above. The SYS enabling signal is also coupled to the pull down legs 232 and 234. The p-bit data is coupled to pull down leg 238, and the complement of the p-bit data PB_C is coupled to pull down leg 228. Each of these pull down legs is enabled by the STOP_CLKD signal provided by the output NOR gate 210, and pull down leg 230 receives the MISR signal.

The XOR function referred to above is implemented with transistors, or gates, 230a–b, 232a–b, 234a–b and 236a–b. The behavior is described as follows:

When both the data RT AND p-bit MISR are the same, the L1 node is pulled low.

When data RT and p-bit MISR are not the same, the L1b node is pulled low which forces the L1 node to be high.

In the case "MISR on" the SYS signal is the complement of p-bit MISR and the signal RC is the complement of SRAM data RT.

When PB_T is 1, MISR_IN is 1, and STOP_B is a 1, the MISR_B signal is a 0. This forces SYS_B to be a 1 through 218 and SYS to 0 through 220a–b, 224a–b.

The MISR_B signal of 0 forces MISR to be a 1 through 216a–b. Now the following relationship is established: MISR equals p-bit and SYS equals the complement of p-bit.

When the signals RT and RC representing data and complement SRAM data, respectively, are brought together with the MISR and SYS signals through gates 230a–b, 232a–b, 234a–b and 236a–b, the XOR function is implemented.

Thus, the four combinations of the two signals SRAM data and p-bit drive the L1 node through the four pull down legs 230a–b, 232a–b, 234a–b and 236a–b.

FIG. 2B further shows the pull down legs 234, 236, and 238 respectively connected to a data hold circuit 240 comprising transistors 240a–c and also 242c–f. This forms a feed back loop of two inverters which performs the hold. The pull down legs 228, 230 and 232 are also connected to the data hold circuit 240. The data hold circuit is the component of latch L1 that holds or stores data that is sent to the latch L1. Latch L1 further comprises a transmission pass gate comprising transistors 242a–b. Pass gate 242 is provided to couple data that is scanned into latch circuit 102, through terminal SI, to the data hold circuit 240. The terminals AT and AC receive clock and complementary clock signals, respectively, for scanning data in through terminal SI.

Referring further to FIG. 2B, there is shown latch L2 provided with a data hold circuit 244, comprising transistors 244a–f, for holding or storing data received by latch L2. Pull down legs 234, 236, and 238 are respectively connected to data hold circuit 244 through a link 246, which is connected to transistors 248a and 250b. The hold circuit 244 is clocked by the clock signals C2 and C2_N. The clock signal C2 is connected to transistors 244a and 250a. The clock signal C2_N is connected to transistors 244d and 248b. The configuration of transistors 252a–f provide outputs DOUT and DOUTB, when data that has been held in latch circuit 102 is being scanned out of the latch circuit. The DOUT output is connected to functional logic as well. Output DOUT_INT sends p-bit data to the next latch in the sequence along bus 110.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A latch circuit for use with one or more RAMs comprising an array, said latch circuit comprising:
    a mode control for providing mode select signals to operate said latch circuit in one of a plurality of modes, said plurality of modes including at least full write and partial write modes;
    a data hold circuit for selectively receiving and storing data coupled to said latch circuit; and
    a first enabling circuit responsive to said mode select signals for enabling said data hold circuit to receive all the data contained in said array during a full write mode, and for further enabling said data hold circuit to receive only some of the data bits contained in said array during a partial write mode, while preventing other of said data bits that are of an uncertain state from entering said latch circuit.

2. The latch circuit of claim 1, wherein:
    said latch circuit includes means for connecting said latch circuit to a second data source; and
    said latch circuit further includes a second enabling circuit for enabling said data hold circuit to receive respective data bits from said second source in place of said data bits contained in said SRAM array that are prevented from entering said latch circuit.

3. The latch circuit of claim 2, wherein:
    said data bits from said second data source comprise data for use in automatic self testing of a sequence of latches associated with said latch circuit.

4. The latch circuit of claim 3, wherein:
    said second data source comprises a MISR, and data from said second data source comprises p-bit data.

5. The latch circuit of claim 4, wherein:
    said SRAM array is disposed to receive a partial write through of data, and said first enabling circuit operates to prevent data from any bit locations of said array that are not written to during said partial write through from entering said latch circuit.

6. The latch circuit of claim 5, wherein:
    said first enabling circuit comprises a dynamic OR gate.

7. The latch circuit of claim 2, wherein:
    said second enabling circuit comprises an XOR gate configured to prevent said data hold circuit from receiving data from said SRAM array and from said second source at the same time.

8. The latch circuit of claim 2, wherein:
    said data hold circuit is included in an L1 latch, and said latch circuit is operable during a scan data in mode to scan data into said L1 latch from a third data source connected to said latch circuit.

9. The latch circuit of claim 8, wherein:
    an L2 latch is connected to said L1 latch, and said latch circuit is operable during a scan data out mode to scan data out of said L2 latch to a data recipient connected to said latch circuit.

10. The latch circuit of claim 2, wherein:
    said RAM array comprises a static RAM array.

11. A latch circuit comprising:
    a data hold circuit for selectively receiving and storing data coupled to said latch circuit;
    means for connecting said latch circuit to an SRAM array disposed to receive a partial write through of data;
    means for connecting said latch circuit to a second data source;
    a first enabling circuit for allowing said data hold circuit to receive certain data bits from said SRAM array, while at the same time preventing data bits from any bit locations of said array that are not written to during said partial write through from entering said latch circuit; and
    a second enabling circuit for enabling said data hold circuit to receive respective data bits from said second source in place of said data bits contained in said SRAM array that are prevented from entering said latch circuit.

12. The latch circuit of claim 11, wherein:
    said data bits from said second data source comprise data for use in automatic self testing of a sequence of latches associated with said latch circuit.

13. The latch circuit of claim 12, wherein:
    said second data source comprises a MISR, and data from said second data source comprises p-bit data.

14. The latch circuit of claim 13, wherein:
    said first enabling circuit comprises a dynamic OR gate.

15. The latch circuit of claim 14, wherein:
    said second enabling circuit comprises an XOR gate configured to prevent said data hold circuit from receiving data from said SRAM array and from said second source at the same time.

16. A method for operating a latch circuit having a data hold circuit array and coupled to an SRAM array, said method comprising the steps of:
    providing mode select signals to operate said latch circuit in one of a plurality of modes, said plurality of modes including at least full write and partial write modes;
    enabling said data hold circuit to receive all the data contained in said array during a full write mode; and
    enabling said data hold circuit to receive only some of the data bits contained in said array during a partial write mode, and at the same time preventing other data bits that are of an "X" state from entering said latch circuit.

17. The method of claim 16, wherein:
    said data hold circuit is enabled to receive respective data bits from a second source connected to said latch circuit in place of said data bits contained in said SRAM array that are prevented from entering said latch circuit.

18. The method of claim 17, wherein:

said data bits from said second data source comprise data for use in automatic self testing of a sequence of latches associated with said latch circuit.

19. The method of claim 18, wherein:

said second data source comprises a MISR, and data from said second data source comprises p-bit data.

20. The method of claim 19, wherein:

said SRAM array is disposed to receive a partial write through of data, and said method includes preventing data from any bit locations of said array that are not written to during said partial write through from entering said latch circuit.

* * * * *